(12) United States Patent
Schwager

(10) Patent No.: US 9,537,532 B2
(45) Date of Patent: Jan. 3, 2017

(54) DEVICE FOR POWER LINE COMMUNICATION, METHOD FOR TRANSMITTING SIGNALS, AND METHOD FOR RECEIVING SIGNALS

(71) Applicant: SONY CORPORATION, Tokyo (JP)

(72) Inventor: Andreas Schwager, Waiblingen (DE)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/431,007

(22) PCT Filed: Sep. 24, 2013

(86) PCT No.: PCT/EP2013/002867
§ 371 (c)(1),
(2) Date: Mar. 25, 2015

(87) PCT Pub. No.: WO2014/056575
PCT Pub. Date: Apr. 17, 2014

(65) Prior Publication Data
US 2015/0256222 A1 Sep. 10, 2015

(30) Foreign Application Priority Data
Oct. 11, 2012 (EP) .................................... 12007050

(51) Int. Cl.
*H04B 3/54* (2006.01)
*H04B 1/04* (2006.01)

(52) U.S. Cl.
CPC *H04B 3/54* (2013.01); *H04B 1/04* (2013.01); H04B 2001/0408 (2013.01); *H04B 2203/5458* (2013.01); *H04B 2203/5466* (2013.01); *H04B 2203/5495* (2013.01)

(58) Field of Classification Search
CPC .............. H04B 2203/5408; H04B 2203/5416; H04B 2203/5425; H04B 3/54; H04B 1/04; H04B 2203/5458; H04B 2203/5466; H04B 2203/5495; H04B 2001/0408
USPC ......................................... 375/257, 295, 316
See application file for complete search history.

(56) References Cited

U.S. PATENT DOCUMENTS

| 7,142,094 | B1 * | 11/2006 | Davidow | H04B 3/54 340/538 |
|---|---|---|---|---|
| 7,977,810 | B2 | 7/2011 | Choi et al. | |
| 8,149,106 | B2 | 4/2012 | Refaeli et al. | |
| 2008/0107242 | A1 | 5/2008 | Ichihara et al. | |

(Continued)

*Primary Examiner* — Freshteh N Aghdam
(74) *Attorney, Agent, or Firm* — Oblon, McClelland, Maier & Neustadt, L.L.P.

(57) ABSTRACT

A device for power line communication is provided, including a transmitter adapted to transmit signals on at least two of a plurality of power line transmission paths of a power line network; a sensor adapted to determine one or a plurality of reflection parameters of one of the plurality of power line transmission paths; and a transmission impedance matching unit adapted to match the output impedance of at least two output ports of the device which each couple to one of the plurality of transmission paths to the impedance of the at least two of the power line transmission paths based on the one or the plurality of reflection parameters. Further, a device including a corresponding reception impedance matching unit is provided and corresponding methods for transmitting and receiving signals.

20 Claims, 9 Drawing Sheets

(56) References Cited

U.S. PATENT DOCUMENTS

| | | | |
|---|---|---|---|
| 2009/0303652 A1* | 12/2009 | Tallam | H02M 1/126 361/111 |
| 2011/0268258 A1* | 11/2011 | Alloin | H04M 3/2209 379/32.04 |
| 2012/0093240 A1 | 4/2012 | McFarland et al. | |
| 2012/0153732 A1* | 6/2012 | Kurs | B60L 3/0069 307/104 |
| 2013/0094517 A1* | 4/2013 | Kim | H04L 29/02 370/474 |

* cited by examiner

DEVICE FOR POWER LINE COMMUNICATION, METHOD FOR TRANSMITTING SIGNALS, AND METHOD FOR RECEIVING SIGNALS

BACKGROUND

Field of the Disclosure

The present disclosure relates to a device for power line communication, a method for transmitting signals and a method for receiving signals.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Current power line communication modems (PLC modems) are based on single input-single output (SISO) schemes. In a single input-single output scheme the signals are fed into a pair of dedicated wires (for instance between the phase or live (P or L) wire and the neutral (N) wire) of a power line network in a building. However, multiple input-multiple output (MIMO) schemes are currently investigated in order to improve e.g. data rate, coverage, robustness against disturbances, utilizing the diversity of the MIMO channel and consideration of electromagnetic interference (EMI) regulations. In MIMO schemes signals are fed into and/or received from at least two combinations of different wires by different input and/or output ports, e.g. between phase and neutral, phase and protective earth (PE), and neutral and protective earth (PE) in a three wire power line network. It is also possible to receive signals from a common mode (CM) signal received between any of the wires to ground.

Power line networks may exhibit strong variations in input impedances at individual transmission frequencies, at different locations of the outlets in the building and due to changing network topology (e.g. when a light switch is toggled by a user). This may have negative impact when feeding and/or receiving power line signals into and/or from power line networks.

SUMMARY

A device for power line communication is provided including a transmitter adapted to transmit signals on at least two of a plurality of power line transmission paths of a power line network; a sensor adapted to determine one or plurality of reflection parameters of one of the plurality of power line transmission paths; and a transmission impedance matching unit adapted to match the output impedance of at least two output ports of the device which each couple to one of the plurality of transmission paths to the impedance of the at least two of the power line transmission paths based on the one or the plurality of reflection parameters. The reflection parameters might be individually adapted at each frequency. There might be one or a plurality of reflections parameters for each input or output port.

Further, a device for power line communication is provided, including a receiver adapted to receive signals on at least two of a plurality of power line transmission paths of a power line network; a sensor adapted to determine one or a plurality of reflection parameters of one of the plurality of power line transmission paths; and a reception impedance matching unit adapted to match the input impedance of at least two input ports of the device which each couple to one of the plurality of transmission paths to the impedance of the at least two of the power line transmission paths based on the one or the plurality of reflection parameters. The impedance matching unit might adapt the impedance matching individually at each frequency of might select the identical termination to all frequencies.

Further, a method for transmitting signals from a device via a plurality of transmission paths of a power line network is provided, including determining one or a plurality of reflection parameters of one of the plurality of power line transmission paths; and matching an output impedance of at least two output ports which each couple to one of the plurality of power line transmission paths to the impedance of at least two of the power line transmission paths based on the one or the plurality of reflection parameters.

Further, a method for receiving signals in a device via a plurality of reception paths of a power line network is provided including determining one or plurality of reflection parameters of one of the plurality of power line reception paths; matching an output impedance of at least two input ports which each couple to one of the plurality of transmission paths to the impedance of at least two of the power line reception paths based on the one or the plurality of reflection parameters.

The foregoing paragraphs have been provided by way of general introduction, and are not intended to limit the scope of the following claims. The described embodiments, together with further advantages, will be best understood by reference to the following detailed description taken in conjunction with the accompanying drawings. The elements of the drawings are not necessarily to scale relative to each other.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DESCRIPTION OF THE EMBODIMENTS

Figure 1:
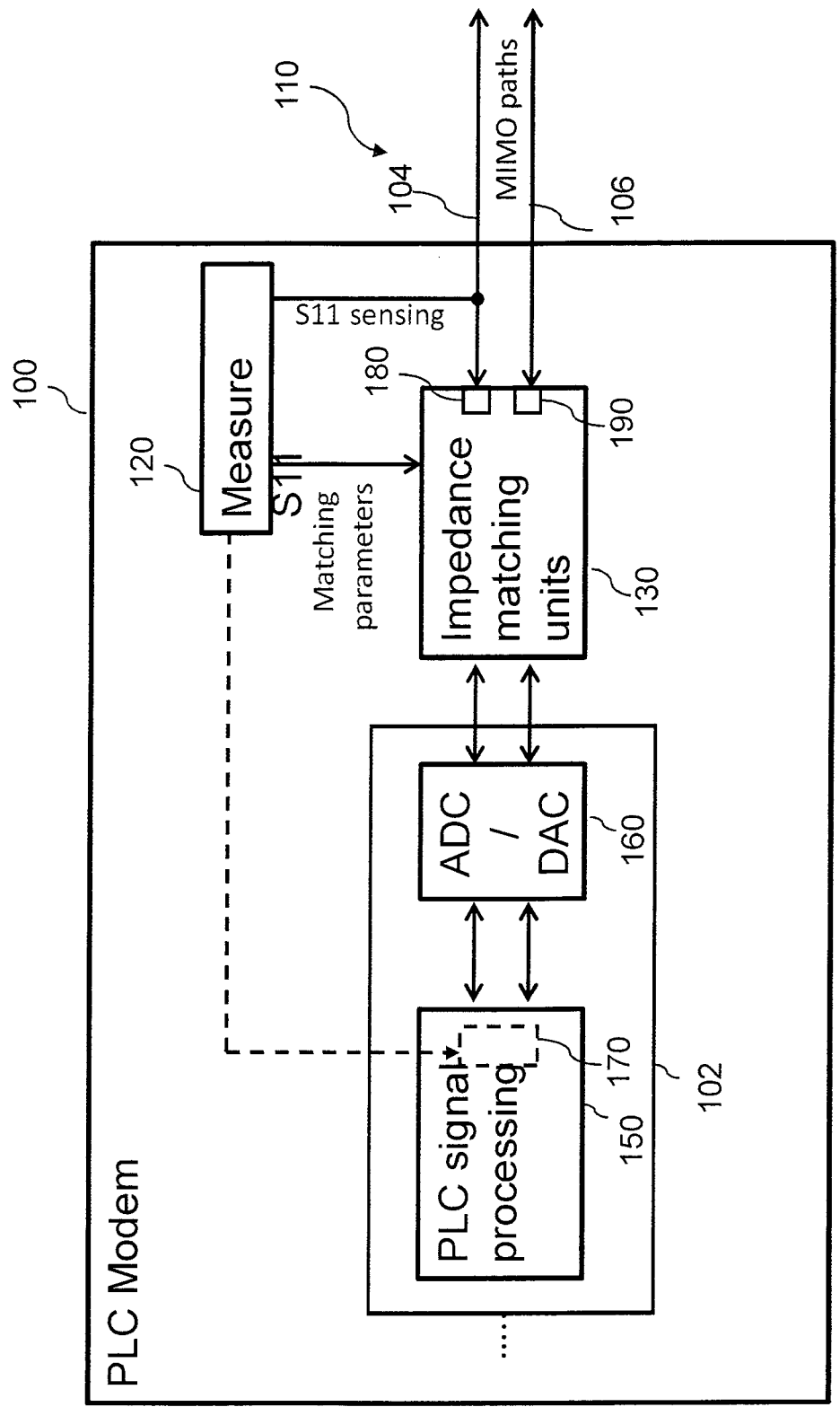
FIG. 1 is a schematic block diagram of a device according to an embodiment of the invention.

Referring now to the drawings, wherein like reference numerals designate identical or corresponding parts throughout the several views, in FIG. 1a device 100 for power line communication according to an embodiment of the invention is depicted.

The device 100 includes a transmitter 102 adapted to transmit signals on at least two of a plurality of transmission paths 104, 106 of a power line network 110. The plurality of transmission paths might include a first transmission path as a differential mode feeding between phase (P) or live (L) wire and neutral wire (N), a second transmission path as a differential mode feeding between the phase (P) or live (L) wire and a protective earth wire (PE), a third transmission path as a differential mode feeding between the neutral wire (N) and the protective earth (PE) wire. It might also be possible that a transmission path might be built by feeding a differential mode between a middle point of L and N towards protective earth.

The transmitter 102 transmits the signals via output ports 180, 190, which each couple with one of the transmission paths 104, 106 used, respectively.

The transmitter might include a power line signal processing unit 150 and an analog-to-digital-converter, digital-to-analog-converter 160.

A sensor 120 is further included in the device 100. The sensor 120 is adapted to determine one or a plurality (e.g. a set) of reflection parameters, also called reflection coefficients or scattering parameters (S11), of one of the plurality of power line transmission paths 104, 106, in the depicted example the reflection parameter for the first transmission path 104. The reflection parameter is also referred to as "S11-parameter". Sensing the reflection parameter might in one embodiment be performed by transmitting a signal into the power lines and measuring the reflected return signal. It is known by a person skilled in the art to use for this a signal source, a reflection bridge and a signal detector.

Based on the determined S11- or reflection parameter a transmission impedance matching unit 130 in the device 100 is adapted to match the output impedance of the at least two output ports 180, 190 of the device to the impedance of the at least two of the power line transmission paths 104, 106. Matching the impedance is done by adjusting the impedance of the impedance matching unit 130 to the conjugate complex impedance of the network (or the individual transmission paths, respectively). The transmission impedance matching unit 130 might be based on programmable analog arrays.

The impedance matching unit 130 might adapt the impedance matching individually at each frequency of might select the identical termination to all frequencies.

Since the impedance is matched identically for at least two output ports and two transmission paths based on a single measurement of the reflection parameter, impedance matching is performed very efficiently.

The power line signal processing unit 150 might optionally include an amplifier 170 that amplifies the power of a signal with an amplification factor prior to transmission, wherein the amplification factor is based on the reflection factor determined by the sensor 120. This might be used to perform a power boost when signal energy is reflected at the feeding outlet. The amplifier might also be located on the analog side one the right hand side of the analog-digital-converter/digital-to-analog converter 160 in FIG. 1. In general, for regulatory purposes only the energy already fed to the mains grid on the test setup is measured for verifying the transmission power. Energy that is reflected at the outlet will not be fed into the grid. This lost energy might be boosted by the PLC modem before transmitting it to the mains. Here the sensing of the reflection data might be done on one path only and applied to the power boost of all or some of the MIMO paths.

Figure 2:
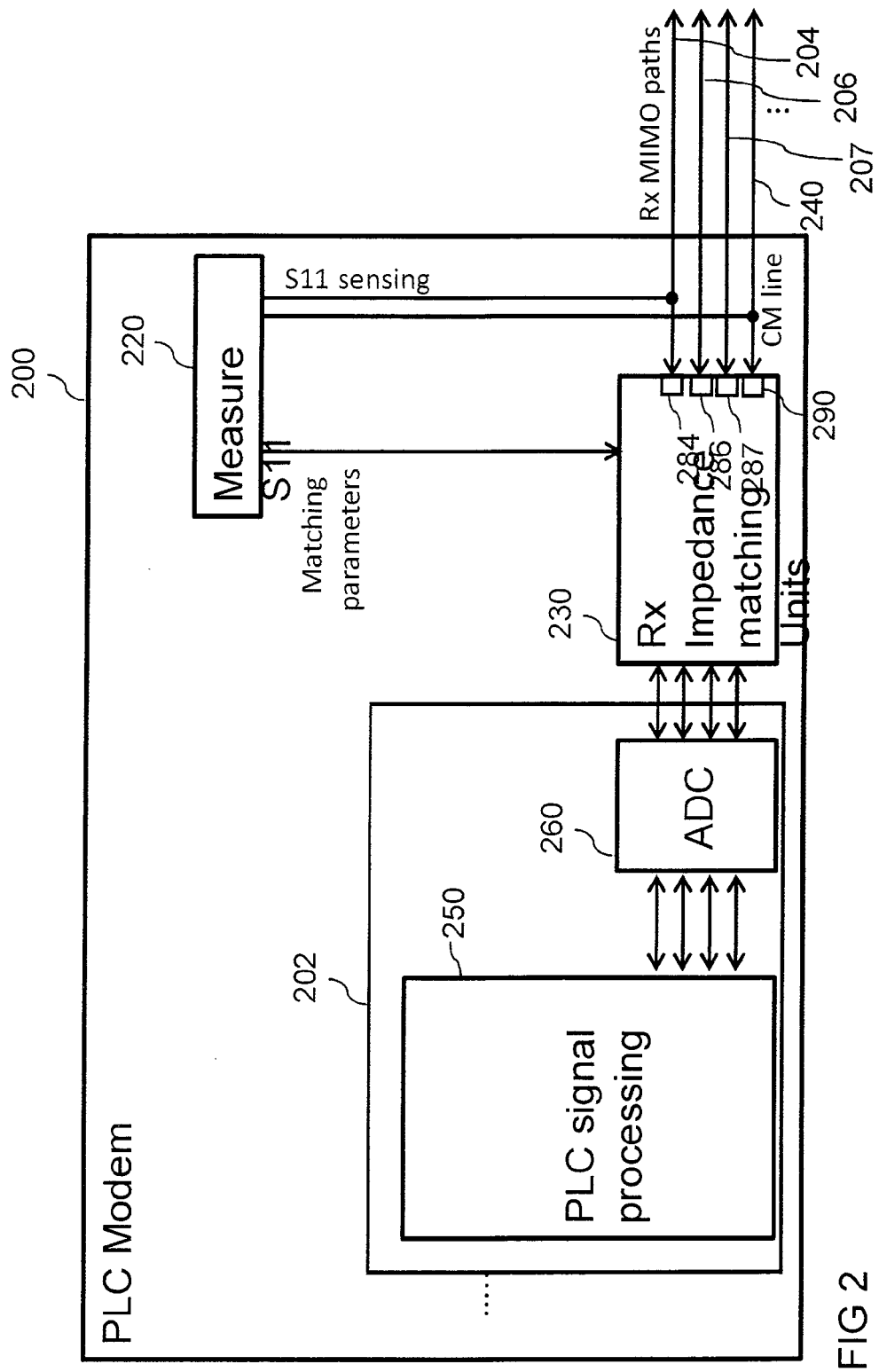
FIG. 2 is a schematic block diagram of a device according to a further embodiment of the invention.

In FIG. 2 a device 200 according to a further embodiment of the invention is depicted. The device 200 includes a receiver 202 adapted to receive signals on at least two of a plurality of reception paths 204, 206, 207 of the power line network 110. The reception paths might include a first reception path as a differential path between a phase (P) or live (L) wire and a neutral wire (N), a second reception path as a differential path between phase (P) or live (L) wire and protective earth wire (PE), a third reception path as a differential path between neutral wire (N) and protective earth (PE) wire. A reception path might also be a single ended path, a common mode path or a differential path between the middle point of L and N wire and protective earth.

The receiver might include a power line signal processing unit 250 and an analog-to-digital-converter 260.

A sensor 220 is further included in the device 200. The sensor 220 is adapted to determine reflection parameters of one of the plurality of power line reception paths 204, 206, 207 in the depicted example the reflection parameter for the first reception path 204.

Based on the determined S11- or reflection parameter a reception impedance matching unit 230 in the device 200 is adapted to match the input impedance of at least two input ports 284, 285, 286 of the device 200 to the impedance of the at least two of the power line reception paths 204, 206, 207. The reception impedance matching unit 230 might in one embodiment be based on programmable analog arrays, which might include multiple capacitive of inductive components. Alternatively, they might be implemented by switchably arranged discrete hardware components. The impedance matching might be done individually for each frequency.

Since the impedance is matched identically for at least two input ports and at least two reception paths based on a single measurement of the reflection parameter, impedance matching is performed very effectively.

The sensor 220 might be further adapted to measure the reflection parameters of a common mode reception path 240, so that the reception impedance matching unit 230 is enabled to match the input impedance of a common mode input port 290 to the common mode reception path 240 as well.

Figure 3:
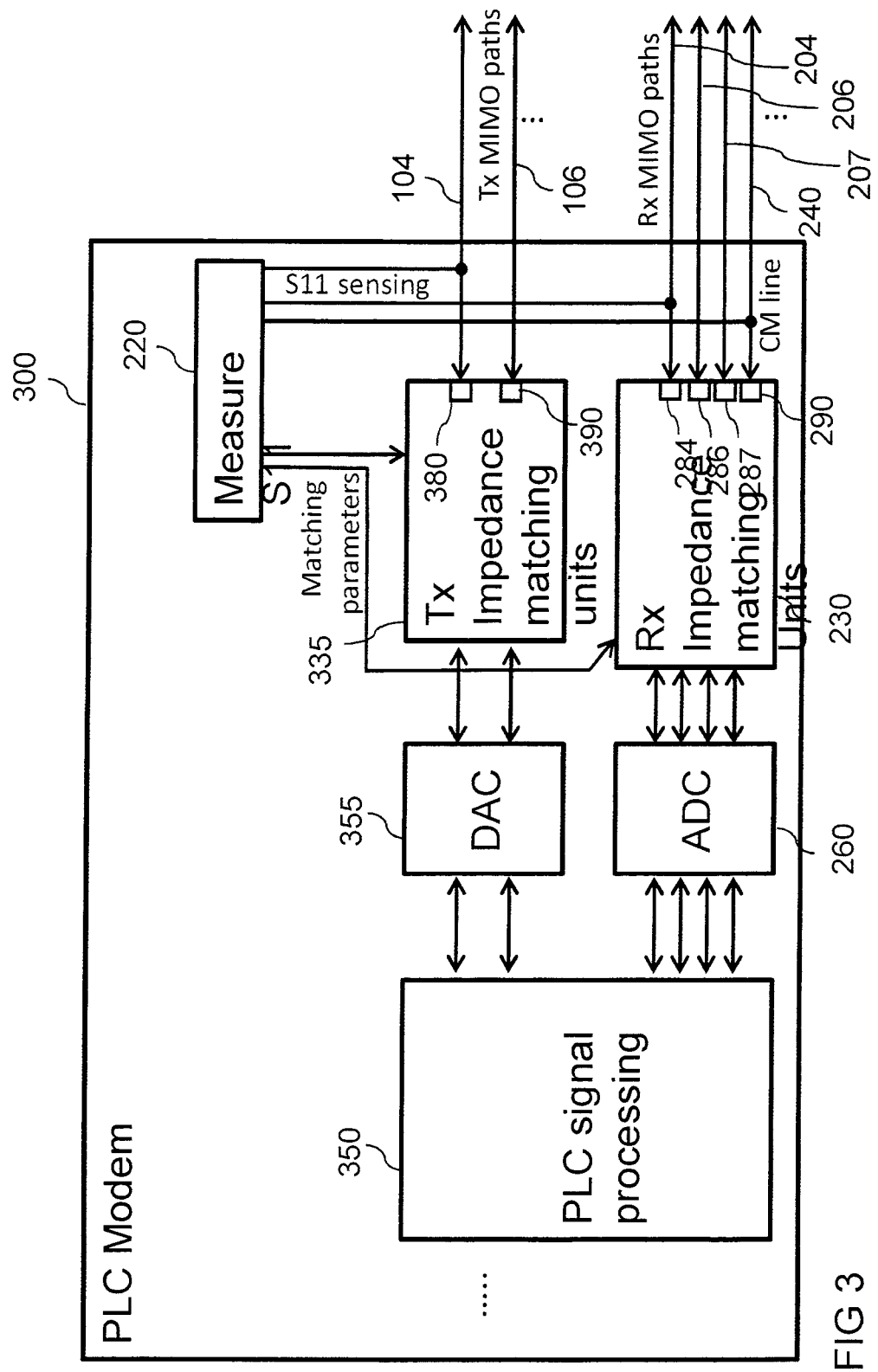
FIG. 3 is a schematic block diagram of a device according to a further embodiment of the invention.

In FIG. 3 a device 300 for power line communication, e.g. a power line communication modem (PLC modem) according to a further embodiment is depicted. This device 300 includes transmitter and receiver functionality, which is exemplarily realized and depicted by a common PLC signal processing unit 350 and the analog-to-digital-converter 260 for the receiver functionality and a digital-to-analog-converter 355 for the transmitter functionality.

A sensor 320 is included in the device 300, which is adapted to determine the reflection parameters of one of the transmission paths 104, 106, and is further adapted to determine the reflection parameters of one of the reception paths 204, 206, 207 which are used for receiving differential mode signals, and is, for instance, further adapted to determine the reflection parameters of the common mode reception path 240. In other embodiments, the sensor 320 is only adapted to measure one of the reflection parameters mentioned above.

Further to the reception impedance matching unit 230 as described with regard to FIG. 2, the device 300 may include a transmission impedance matching unit 335. The sensor 320 provides the determined reflection parameters for the one transmission path to the transmission impedance matching unit 335 and the reflection factors for the one reception path and for the common mode reception path 240 to the reception impedance matching unit 230. Based on the determined reflection parameters, the transmission impedance matching unit 335 and the reception impedance matching unit 230 adapt the input and the output impedances of the input ports 180, 190 and the output ports 284, 286, 287 and 290 of the device 300 to the impedance of the transmission paths 104, 106 and to the reception paths 204, 206, 207, 240.

Since the impedance is matched identically for at least two transmission paths based on a single measurement of the reflection parameters, and the impedance is matched identically for at least two reception paths, impedance matching is performed very efficiently.

Figure 4:
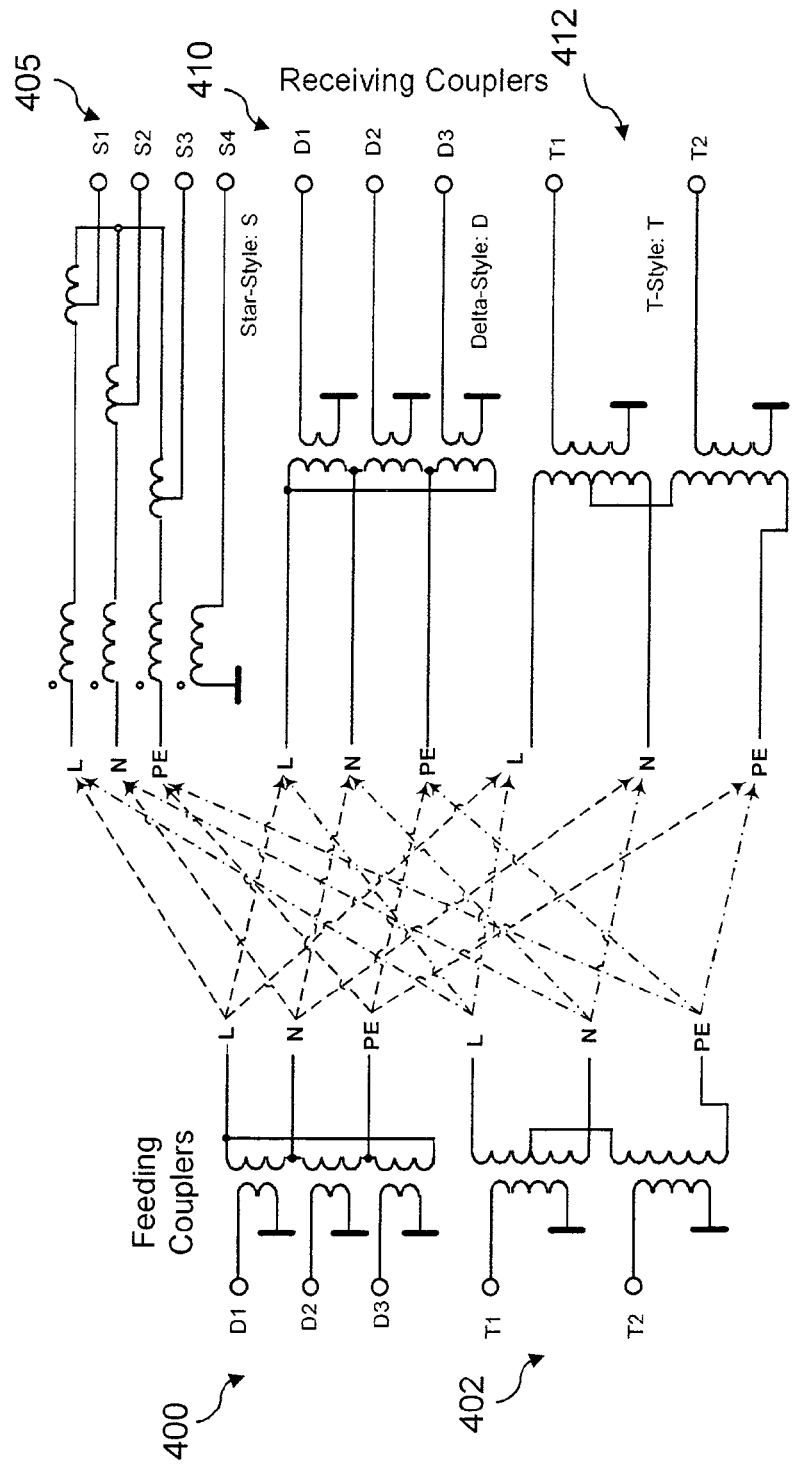
FIG. 4 is a schematic diagram illustrating possibilities to feed signals into a 3 wire power line system and to receive signals from the 3 wire power line system.

FIG. 4 depicts different kinds of feeding and receiving styles for MIMO power line communication. The dashed lines in the middle of FIG. 4 represent individual wires of a mains grid. Components that are used for safety or blocking the AC voltage on the mains grid are not depicted in FIG. 4. On the left hand side two different known feeding couplers (Delta-style coupler 400 and T-style coupler 402) are shown. The right hand side shows three different known receiving couplers: Star-style coupler 405, Delta-style coupler 410 and T-style coupler 412.

To avoid the injection of Common Mode (CM) signals, feeding PLC signals should be done using Delta-style coupler 400 (top left side in FIG. 4) or T-style coupler 402 (lower left side in FIG. 4) couplers. The symmetrical implementation of the Delta-style coupler 400 and the T-style coupler 402 guarantees that no CM signals are generated at the point of signal injection.

The Delta-style coupler 400 or also called transversal coupler consists of three baluns arranged in a triangle between live, neutral and protective earth. The sum of the three voltages injected is equal to zero (as proven by Kirchhoff's law). Hence, only two of the three signals are independent of each other.

FIG. 7 shows statistical data on the properties of multiple PLC channels.

These data are recorded where all three baluns were present and terminated by 50Ω on the measurements instruments site (at ports D1, D2 and D3). Terminating the ports provides most reproducible results and avoids additional signal reflections caused by connecting measurement equipment.

When terminating the three wire system, the impedance of each wire pair is present three times in parallel. A PLC modem implementation might terminate two or three of the three wires with e.g. a low impedance for transmissions and a high impedance when receiving signals. All baluns might be of the same type (for instance, Guanella transformers 1:4 with a very low loss).

The T-style coupler 402 feeds a differential mode signal between live and neutral contact plus a second signal between the middle point of live-neutral to the protective earth. The second signal is a quasi common mode signal between live-neutral and the earth wire. Again, the two T-ports are terminated to minimize reflections at the coupler.

Receiving the PLC signals (depicted at the right side in FIG. 4) is also possible using the star-style or longitudinal coupler 405. The three wires are connected in a star topology to the center point. Here, Kirchhoff's law also forces the sum of all currents arriving at the center point to be zero. Hence, only two of the three signals are independent. However, due to parasitic component in a coupler the reception of the signals at the third port additionally improves the throughput capacities of MIMO PLC. Furthermore the star-style coupler 405 allows the reception of common mode signals which enables a forth receive path. The CM transformer is magnetically coupled (Faraday type).

A Delta-style coupler 410 and a T-style coupler 412 might also be used for signal reception. Feeding signals using the Star-style coupler might cause injecting CM signals resulting in radiations and interference problems to radio applications.

Safety components in the couplers to protect the operator and the sensitive measurement equipment (50 Hz level, surge protection) are documented in [ETSI TR 101 562-1]. The ETSI TR also documents the calibration data of the couplers.

Figure 5:
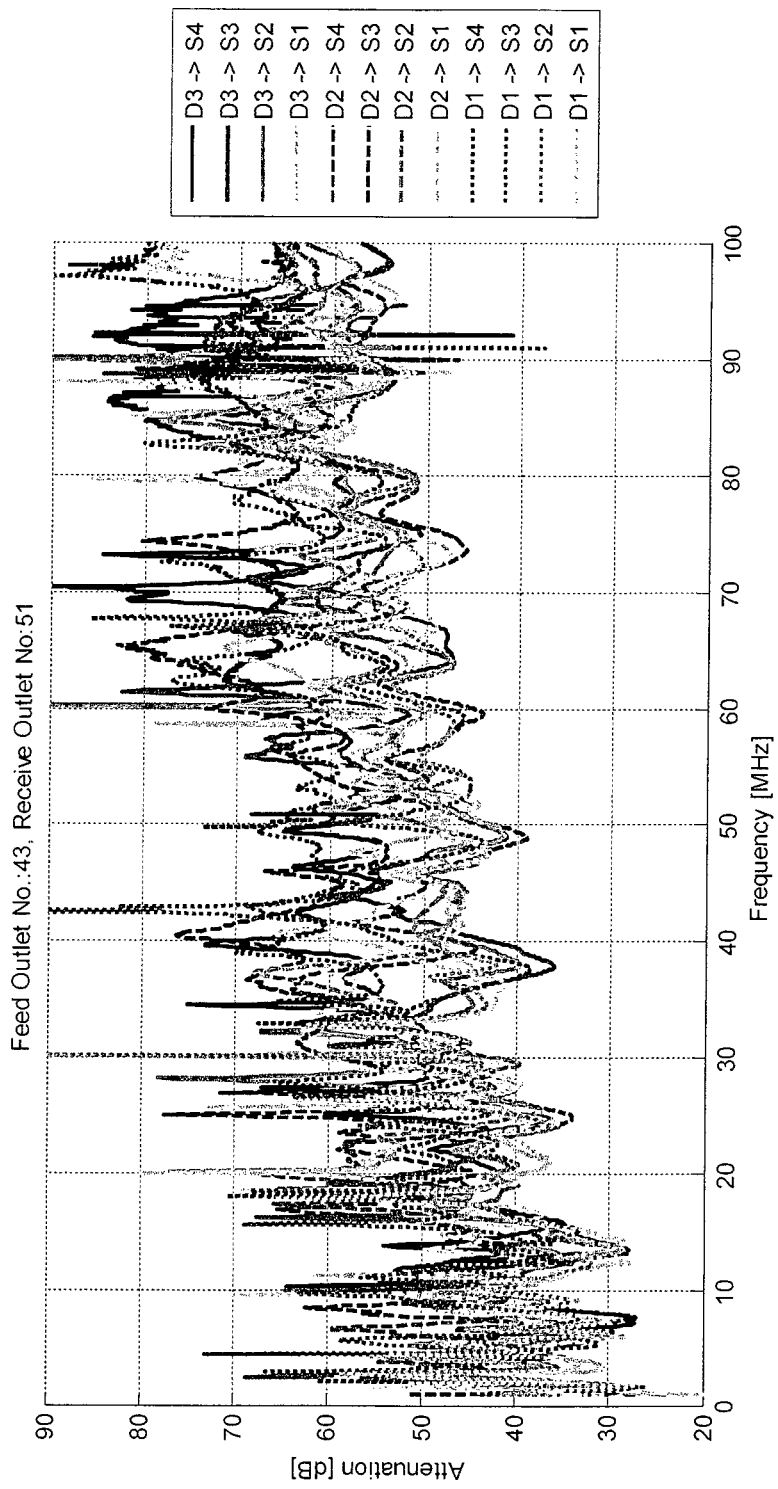
FIG. 5 illustrates a measured attenuation versus frequency for different feeding and reception possibilities.

FIG. 5 depicts of the attenuation as collected by individual frequency sweeps of all MIMO channels between two outlets. There are 12 sweeps in total transmitted at the ports D1, D2 and D3, respectively, of the Delta-style coupler 400 and received at the ports S1, S2, S3 and the CM port S4, respectively, of the Star-style coupler 405.

Attenuation or channel measurements of individual MIMO paths provide a significant variance in between the individual paths. At most frequencies the difference between the maximally and the mininimally attenuated paths is more than factor 100.

Figure 6:
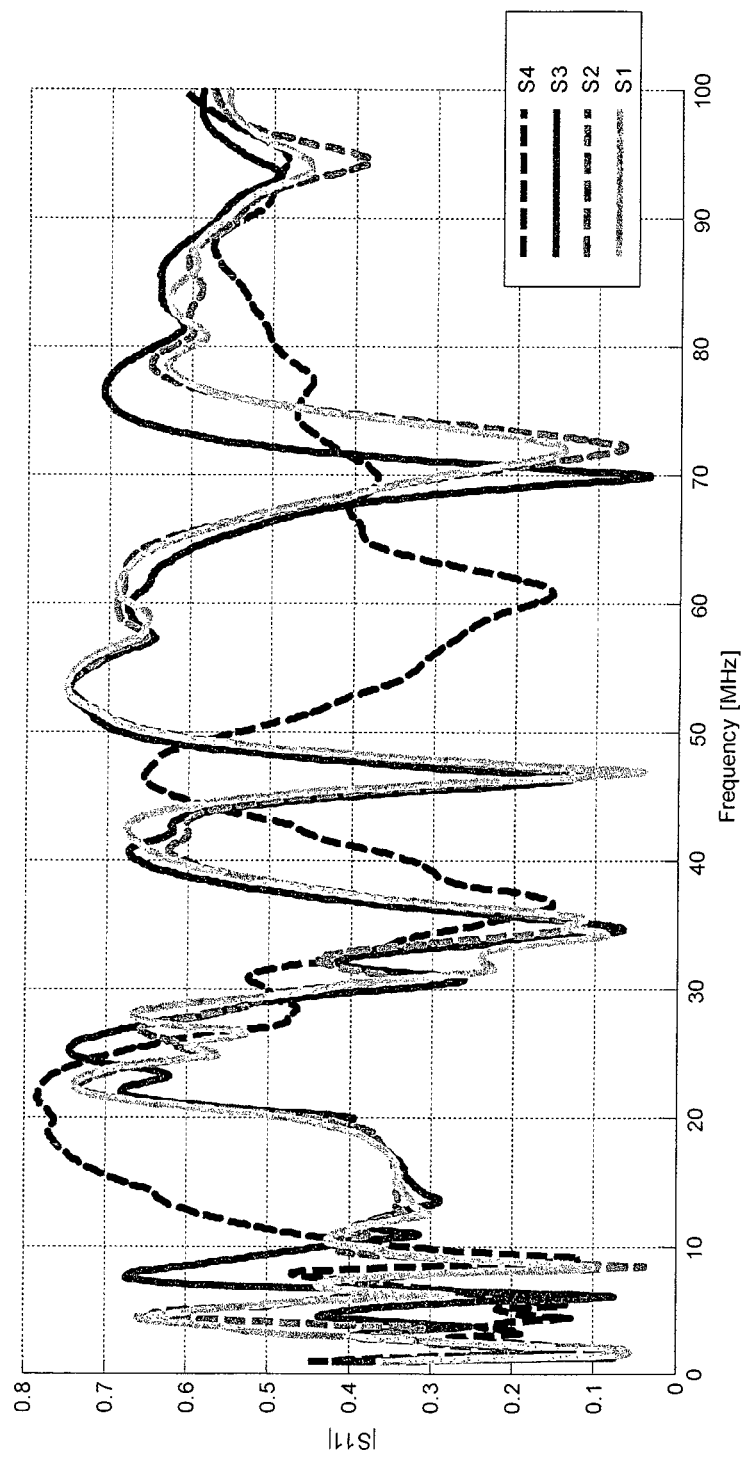
FIG. 6 illustrates a measured reflection parameter S11 versus frequency for a star-style coupler at an outlet.

FIG. 6 presents a sweep recording the reflection parameter at the Star-style coupler 405. The three single ended ports S1, S2 and S3 show above 10 MHz very similar reflection characteristics. The common mode (CM) sweep (S4) provides less variance over the frequency. The common mode signal is the voltage between the sum of the three Star-style signals and ground.

Figure 7C:
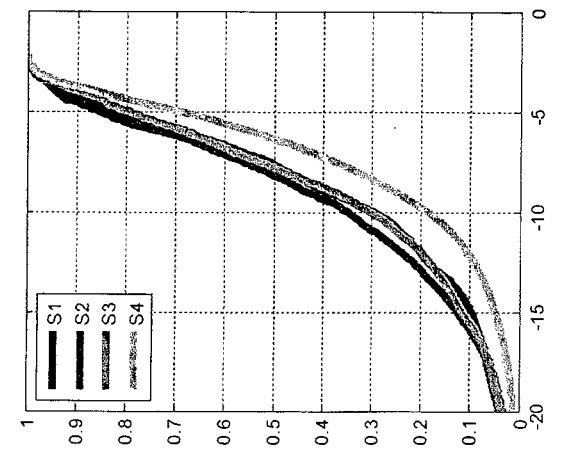
FIG. 7c illustrates a cumulative distribution function (CDF) of the magnitude of the reflection parameter S11 from a Star-style coupler.
Figure 7B:
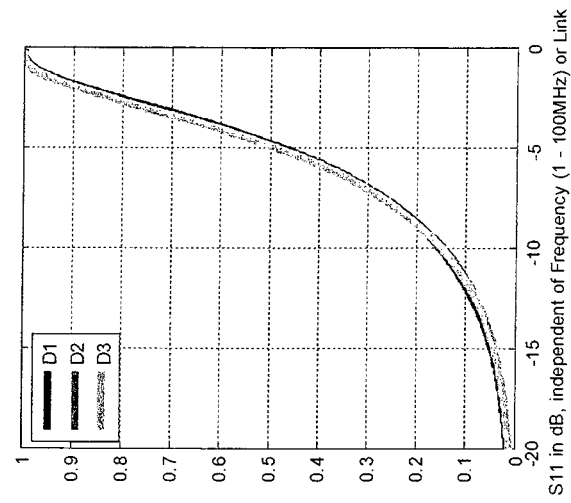
FIG. 7b illustrates a cumulative distribution function (CDF) of the magnitude of the reflection parameter S11 from a Delta-coupler.
Figure 7A:
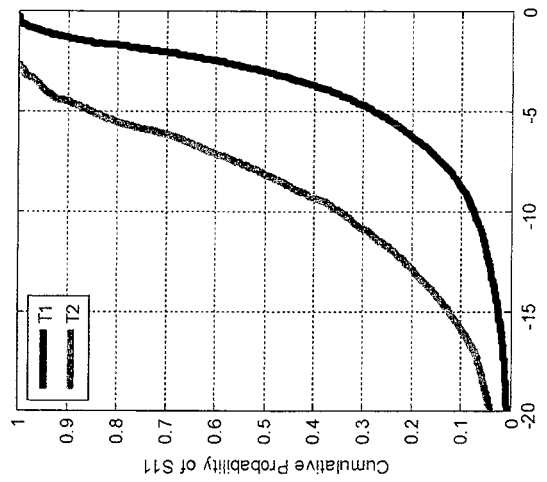
FIG. 7a illustrates a cumulative distribution function of the magnitude of the reflection parameter S11 from a T-style coupler.

FIGS. 7a, 7b and 7c show an overview of the probability of measuring a reflection parameter by depicting the cumulative probability of S11 for a T-style coupler 402, 412 (FIG. 7a), a Delta-style coupler 400, 410 (FIG. 7b) and a Star-style coupler 405 (FIG. 7c). FIG. 7 shows very high reflection coefficients. This results in weak impedance matching conditions of the power line network (indoor power line network) where the measurements have been taken. If the S11 parameter is less (more negative) than −6 dB, more than half of the feed signals are reflected back to the coupler and the connected outlet. This is the case for more than 60% of all S11 measurements conducted using delta ports D1, D2, or D3 or the T-feeding port T1. Thus, it is clear that enhanced impedance matching might improve the throughput rates of PLC modems considerably.

As can be derived from FIG. 7, the absolute scattering parameter |S11| of the CM port and the single ended lines S1, S2 and S3 of the Star-style coupler 405 and the differential mode T2 of the T-style coupler has higher values than the absolute scattering parameter |S11| of the differential modes of the Delta-style coupler and the differential mode T1 of the T-style coupler.

Figure 8:
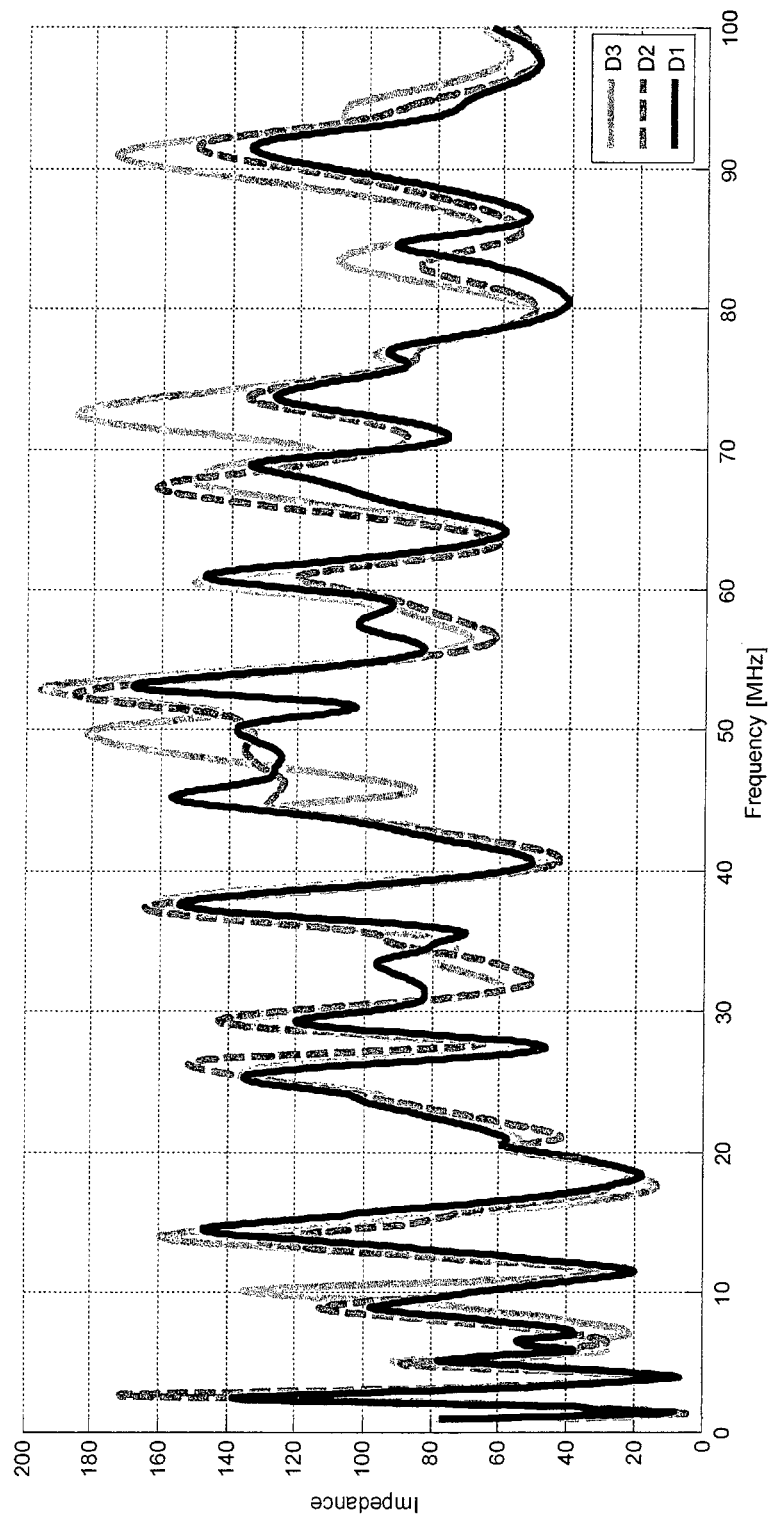
FIG. 8 illustrates the impedance in Ohm versus frequency at ports D1 to D3 of a delta-type coupler of an outlet.

The impedances of the delta ports D1, D2 and D3 at an exemplary outlet are shown versus frequency in FIG. 8. It can be observed that the variance of the impedance values in-between the individual ports is small. This phenomenon was also found at the single ended Star-ports of FIG. 4, see the measurement results shown in FIG. 6. Hence, for matching the impedance of a MIMO PLC coupler to the mains, the MIMO paths can be matched identically (i.e. using one or more reflection parameters measured for only one of the MIMO paths).

When PLC signal feeding is performed with the Delta-style coupler 400 and receiving is done by the Star-style coupler 405, the ports D1, D2 and D3 of the Delta-style coupler 400 might be terminated identically and the ports S1, S2 and S3 of the Star-style coupler 405 might also be terminated identically. The group of the D-port's termination and the group of the S-port's termination might be matched individually.

PLC modems might also perform a power boost when signal energy is reflected at the feeding outlet. In general, for regulatory purposes only the energy already fed to the mains grid on the test setup is measured for verifying the transmission power. Energy that is reflected at the outlet will not be fed into the grid. This lost energy might be boosted by the PLC modem before transmitting it to the mains. Here, again, the sensing of the reflection data might be done on one MIMO path only and applied to the power boost of further MIMO PLC paths.

Figure 9:
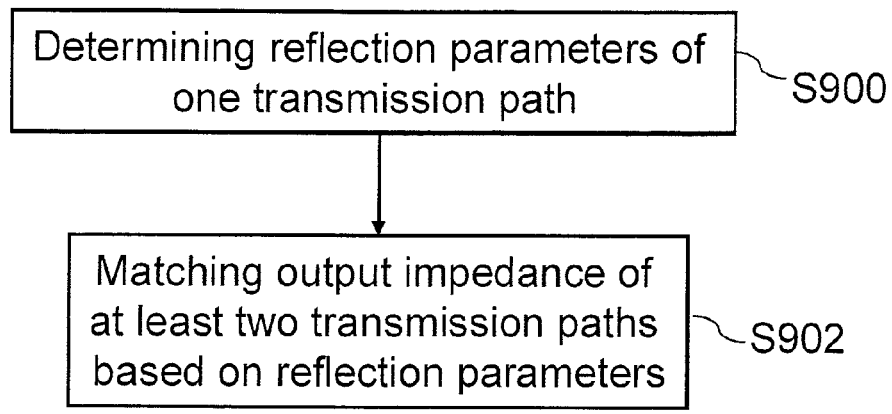
FIG. 9 shows a schematic flow diagram of a method according to an embodiment of the invention.

In FIG. 9 a schematic flow diagram of a method for transmitting signals from a device for power line communication via a plurality of transmission paths of a power line network is depicted. In S900 reflection parameters are determined for one of the plurality of power line transmission paths, which is used in S902 to match an output impedance of at least two output ports of the device to at least two of the power line transmission paths.

Figure 10:
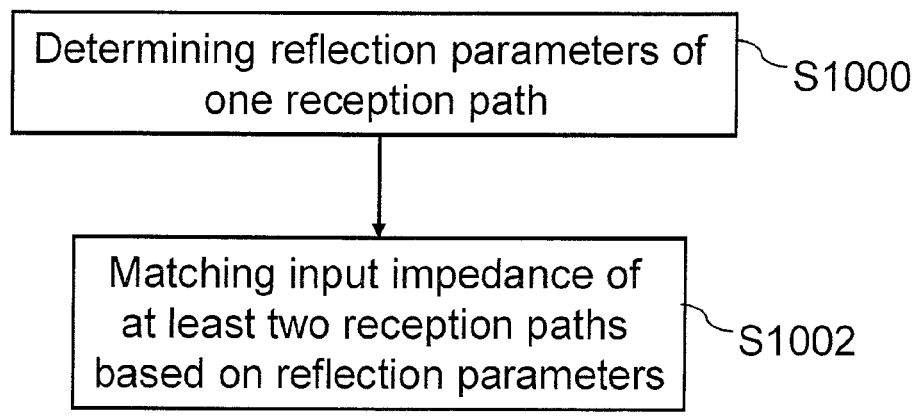
FIG. 10 illustrates a schematic flow diagram of a method according to a further embodiment of the invention.

In FIG. 10 a schematic flow diagram of a method for receiving signals in a device for power line communication via a plurality of reception paths of a power line network is depicted. In S1000 reflection parameters of one of the reception paths is determined, which is used in S1002 to match an input impedance of at least two input ports of the device to at least two of the power line reception paths.

With the proposed devices and methods it is possible to match the input and output impedances to a plurality of transmission and reception paths effectively, since only the reflection parameter of one of the respective paths has to be measured and identical impedance matches can be used for a plurality of paths.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A device for power line communication, the device comprising:
   a multiple-input-multiple-output (MIMO) transmitter configured to concurrently transmit signals via a first output port coupled to a first power line transmission path and a second output port coupled to a second power line transmission path, the first and second power line transmission paths included in a plurality of power line transmission paths of a power line network;
   a sensor configured to determine at least one reflection parameter of at least one of the first and second power line transmission paths; and
   a transmission impedance matching circuit configured to identically match, based on the at least one reflection parameter, a first output impedance of the first output port to a first impedance of the first power line transmission path and a second output impedance of the second output port to a second impedance of the second power line transmission path.

2. The device according to claim 1, further comprising:
   a MIMO receiver configured to concurrently receive signals via a first input port coupled to the first power line transmission path and a second input port coupled to the second power line transmission path; and
   a reception impedance matching circuit configured to match, based on the at least one reflection parameter, a first input impedance of the first input port to the first impedance of the first power line transmission path and a second input impedance of the second input port to the second impedance of the second power line transmission path.

3. The device according to claim 2, wherein
   the sensor is further configured to determine a common mode reflection parameter of a common mode reception path, and
   the reception impedance matching circuit is further configured to match, based on the common mode reflection parameter, an impedance of a common mode input port to an impedance of the common mode reception path.

4. The device according to claim 1, further comprising:
   an amplifier configured to amplify a power of at least one of the signals prior to transmission with an amplification factor, wherein
   the amplification factor for the signals is based on the at least one reflection parameter.

5. The device according to claim 1, wherein the first and second power line transmission paths are within a same power line connected to the device.

6. The device according to claim 1, wherein the sensor determines the at least one reflection parameter by transmitting a sense signal into the first and second power line transmission paths, and measuring a reflected return signal.

7. The device according to claim 1, wherein the first impedance is a conjugate complex impedance of the first power line transmission path, and the second impedance is a conjugate complex impedance of the second power line transmission path.

8. The device according to claim 1, wherein the transmission impedance matching circuit is configured to individually match each transmission frequency.

9. A device for power line communication, the device comprising:
   a multiple-input-multiple-output (MIMO) receiver configured to concurrently receive signals via a first input port coupled to a first power line reception path and a second input port coupled to a second power line reception path, the first and second power line reception paths included in a plurality of power line reception paths of a power line network;
   a sensor configured to determine at least one reflection parameter of at least one of the first and second power line reception paths; and
   a reception impedance matching circuit configured to identically match, based on the at least one reflection parameter, a first input impedance of the first input port to a first impedance of the first power line reception path and a second input impedance of the second input port to a second impedance of the second power line reception path.

10. The device according to claim 9, wherein
the sensor is further configured to determine a common mode reflection parameter of a common mode reception path, and
the reception impedance matching circuit is further configured to match, based on the common mode reflection parameter, an input impedance of a common mode input port to an impedance of the common mode reception path.

11. The device according to claim 9, wherein the first and second power line reception paths are within a same power line connected to the device.

12. The device according to claim 9, wherein the sensor determines the at least one reflection parameter by transmitting a sense signal into the first and second power line transmission paths, and measuring a reflected return signal.

13. The device according to claim 9, wherein the first impedance is a conjugate complex impedance of the first power line reception path, and the second impedance is a conjugate complex impedance of the second power line reception path.

14. The device according to claim 9, wherein the reception impedance matching circuit is configured to individually match each reception frequency.

15. A multiple-input-multiple-output (MIMO) method, comprising:
concurrently transmitting, by a MIMO transmitter of a device, signals via a first output port coupled to a first power line transmission path and a second output port coupled to a second power line transmission path, the first and second power line transmission paths included in a plurality of transmission paths of a power line network;
determining, by a sensor of the device, at least one reflection parameter of at least one of the first and second power line transmission paths; and
identically matching, by a transmission impedance matching circuit of the device based on the at least one reflection parameter, a first output impedance of the first output port to a first impedance of the first power line transmission path and a second output impedance of the second output port to a second impedance of the second power line transmission path.

16. The MIMO method according to claim 15, wherein the first and second power line transmission paths are within a same power line connected to the device.

17. The MIMO method according to claim 15, further comprising:
concurrently receiving signals via a first input port coupled to the first power line transmission path and a second input port coupled to the second power line transmission path; and
matching, based on the at least one reflection parameter, a first input impedance of the first input port to the first impedance of the first power line transmission path and a second input impedance of the second input port to the second impedance of the second power line transmission path.

18. The MIMO method according to claim 17, further comprising:
determining a common mode reflection parameter of a common mode reception path, and
matching, based on the common mode reflection parameter, an impedance of a common mode input port to an impedance of the common mode reception path.

19. A multiple-input-multiple-output (MIMO) method, comprising:
concurrently receiving, by a MIMO receiver of a device, signals via a first input port coupled to a first power line reception path and a second input port coupled to a second power line reception path, the first and second power line reception paths included in a plurality of reception paths of a power line network;
determining, by a sensor of the device, at least one reflection parameter of at least one of the first and second power line reception paths; and
identically matching, by a reception impedance matching circuit of the device based on the at least one reflection parameter, a first input impedance of the first input port to a first impedance of the first power line reception path and a second input impedance of the second input port to a second impedance of the second power line reception path.

20. The MIMO method according to claim 19, wherein the first and second power line reception paths are within a same power line connected to the device.

* * * * *